United States Patent
Nitta

(10) Patent No.: US 10,014,346 B2
(45) Date of Patent: Jul. 3, 2018

(54) SEMICONDUCTOR MEMORY DEVICE AND METHOD OF MANUFACTURING THE SAME

(75) Inventor: Hiroyuki Nitta, Yokkaichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 459 days.

(21) Appl. No.: 13/033,026

(22) Filed: Feb. 23, 2011

(65) Prior Publication Data

US 2011/0204309 A1    Aug. 25, 2011

(30) Foreign Application Priority Data

Feb. 25, 2010 (JP) .................................. 2010-040613

(51) Int. Cl.
| | |
|---|---|
| H01L 45/00 | (2006.01) |
| H01L 21/02 | (2006.01) |
| H01L 27/24 | (2006.01) |
| H01L 27/10 | (2006.01) |
| H01L 27/06 | (2006.01) |

(52) U.S. Cl.
CPC ............ *H01L 27/24* (2013.01); *H01L 27/101* (2013.01); *H01L 27/0688* (2013.01)

(58) Field of Classification Search
CPC .... H01L 27/0688; H01L 27/101; H01L 27/24
USPC .............. 257/2, E21.004, E45.001; 438/381
See application file for complete search history.

(56) References Cited

U.S. PATENT DOCUMENTS

| | | | | |
|---|---|---|---|---|
| 2009/0283737 A1* | 11/2009 | Kiyotoshi | ............ | H01L 27/101 257/2 |
| 2010/0032725 A1 | 2/2010 | Baba et al. | | |
| 2010/0038616 A1* | 2/2010 | Nagashima et al. | ............... | 257/2 |
| 2010/0187591 A1* | 7/2010 | Nagashima | ......... | H01L 27/2481 257/314 |

FOREIGN PATENT DOCUMENTS

| | | |
|---|---|---|
| JP | 2008-78395 A | 4/2008 |
| JP | 2008-258493 | 10/2008 |
| JP | 2009-283498 A | 12/2009 |

OTHER PUBLICATIONS

U.S. Appl. No. 12/727,807, filed Mar. 19, 2010, Hiroyuki Nagashima.
U.S. Appl. No. 12/821,585, filed Jun. 23, 2010, Takayuki Toba et al.
Office Action dated Oct. 1, 2013 in Japanese Patent Application No. 2010-040613 with English language translation.

* cited by examiner

*Primary Examiner* — Lynne Gurley
*Assistant Examiner* — Vernon P Webb
(74) *Attorney, Agent, or Firm* — Oblon, McClelland, Maier & Neustadt, L.L.P.

(57) ABSTRACT

According to one embodiment, a semiconductor memory device includes a first interconnect, a second interconnect, a first fringe and a second fringe. The first interconnect is connected to a first memory cell. The second interconnect is connected to a second memory cell and is arranged at a first interval from the first interconnect in a first direction. The first fringe is formed on one end of the first interconnect. The second fringe is formed on one end of the second interconnect. The first fringe and the second fringe are arranged at the first interval in a second direction orthogonal to the first direction.

10 Claims, 18 Drawing Sheets

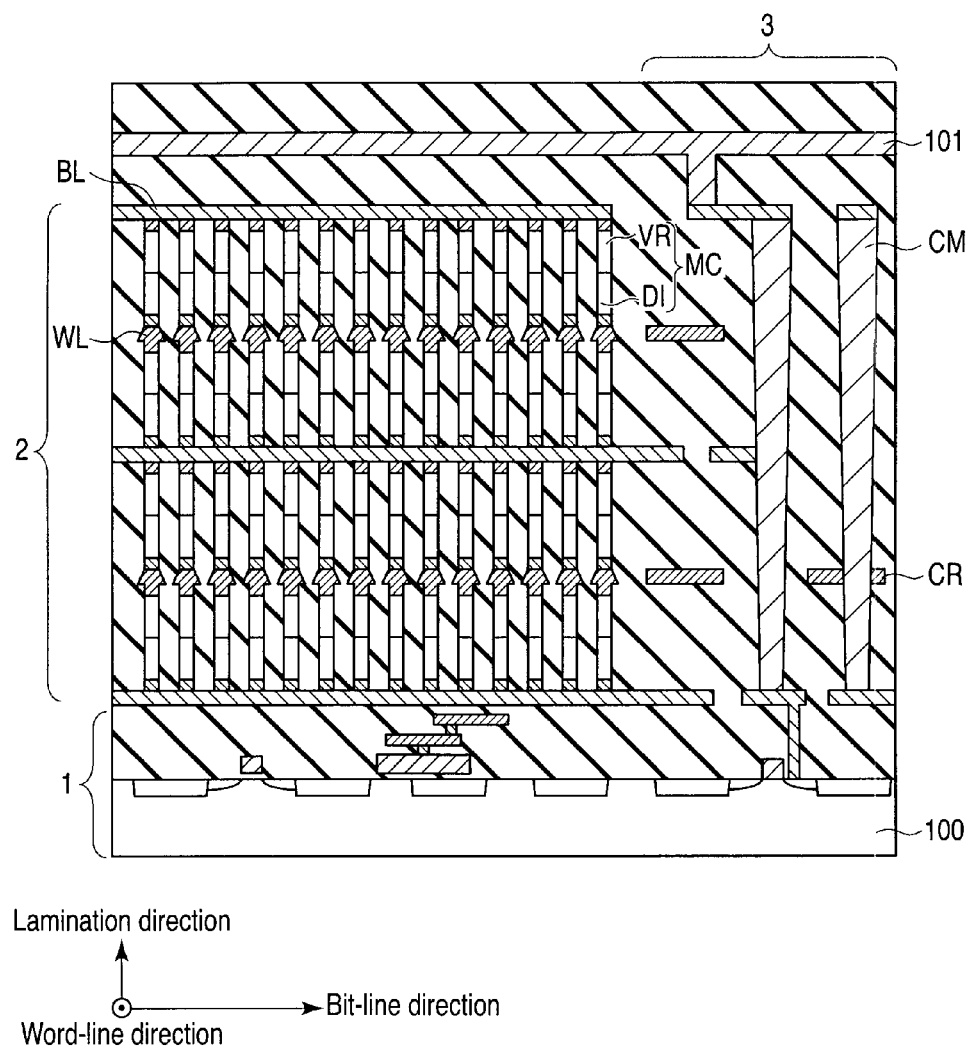
F I G. 1

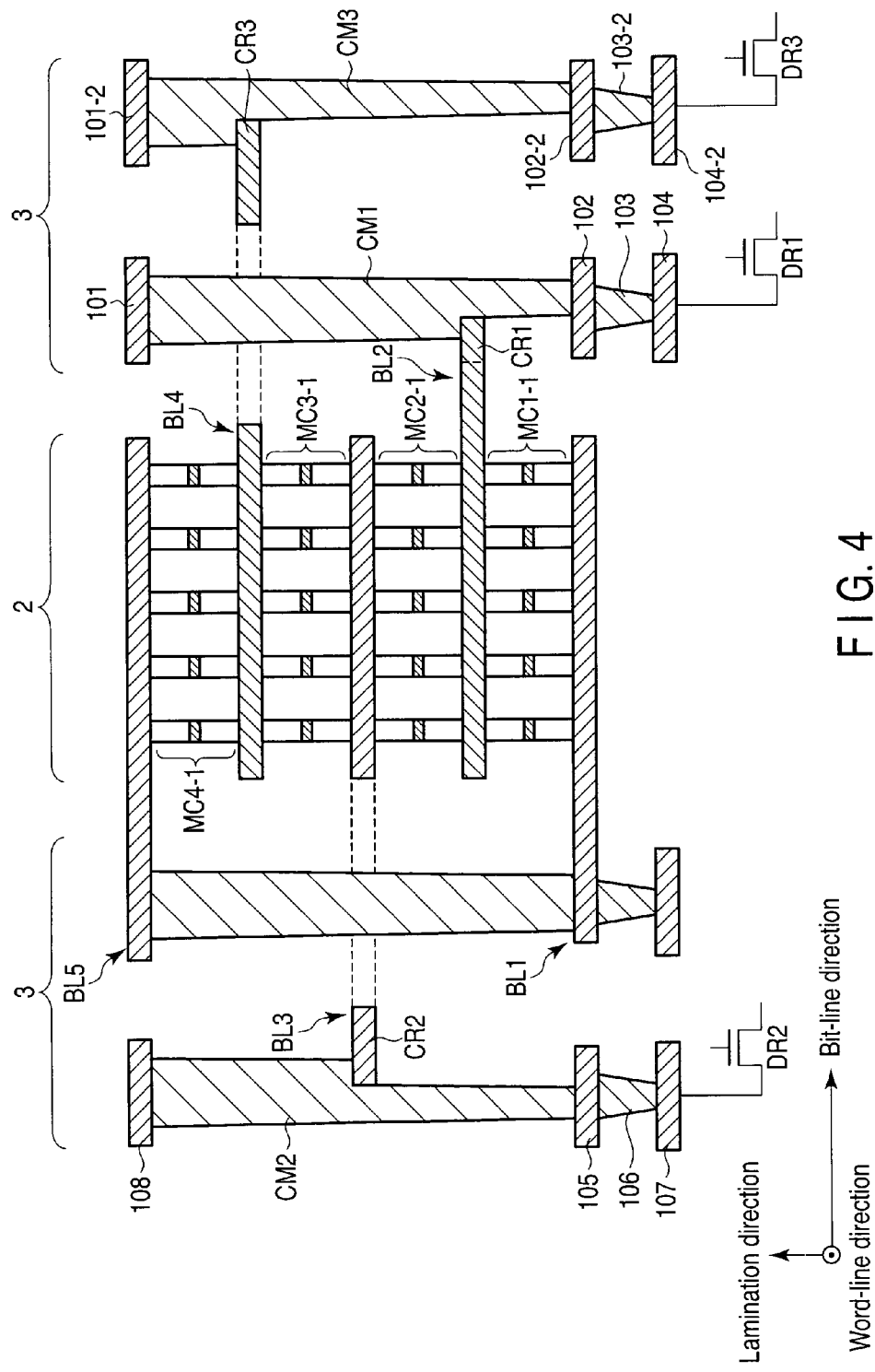
F I G. 4

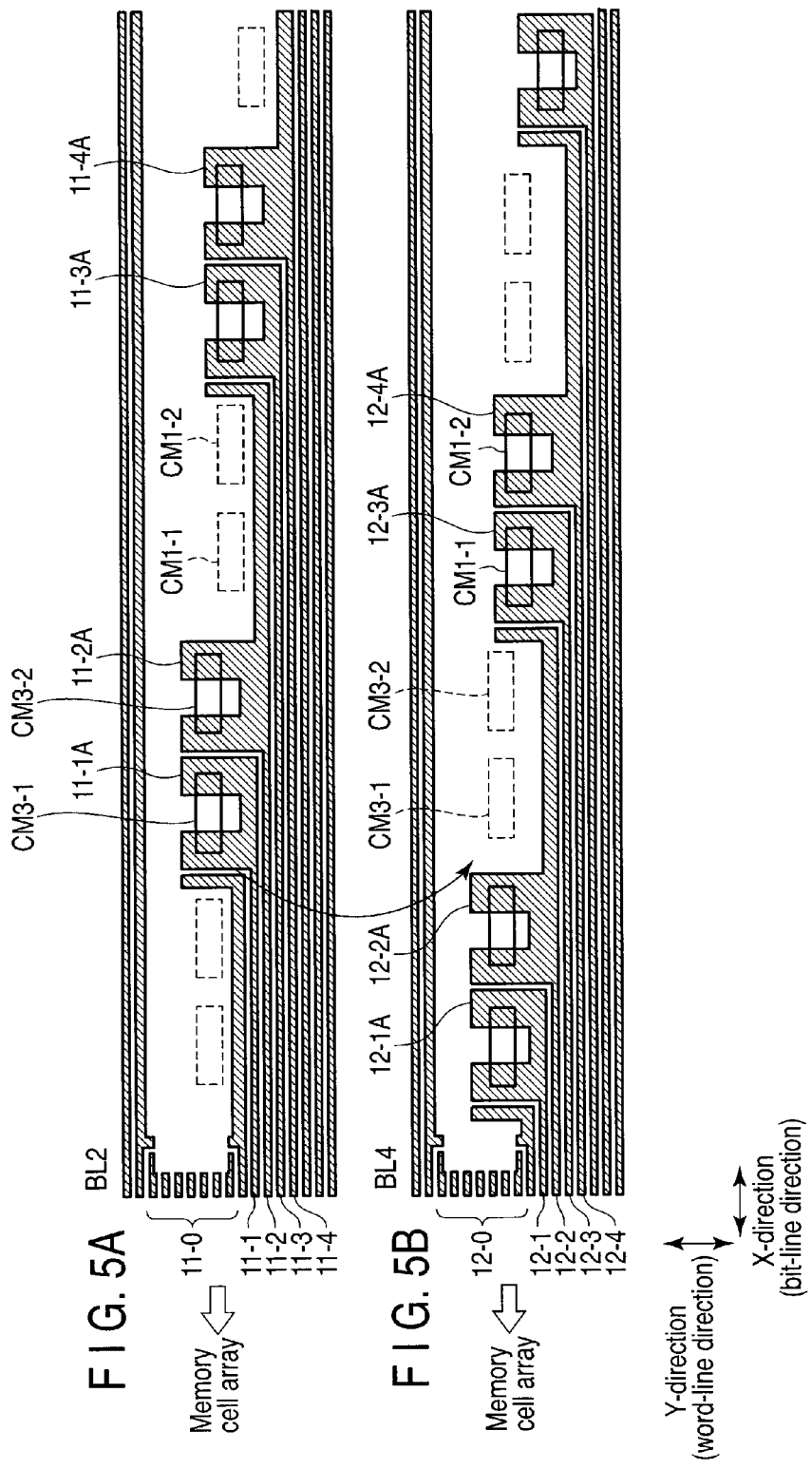

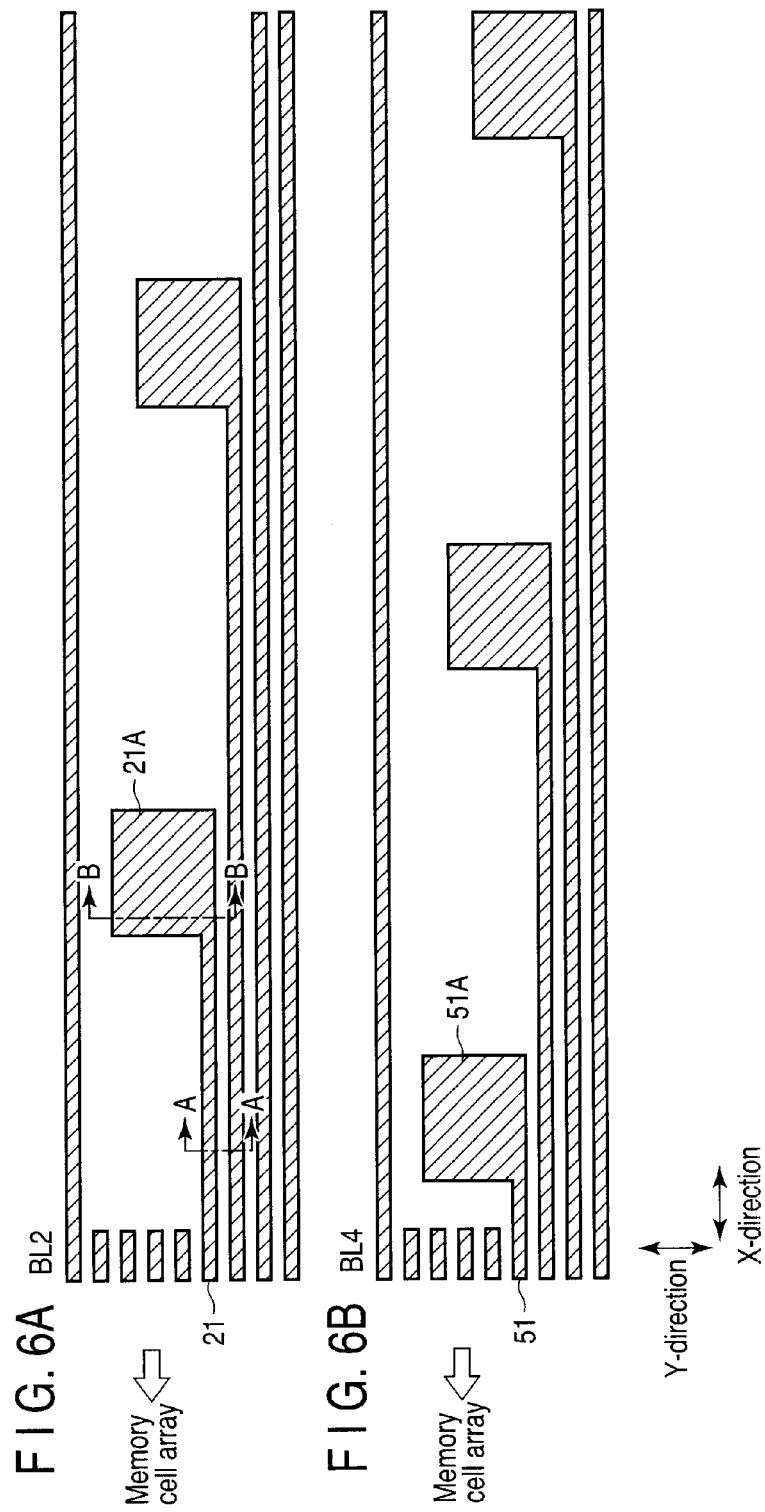

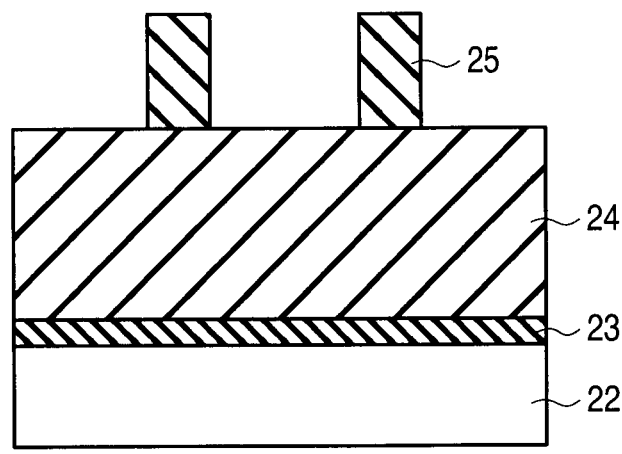
F I G. 8A
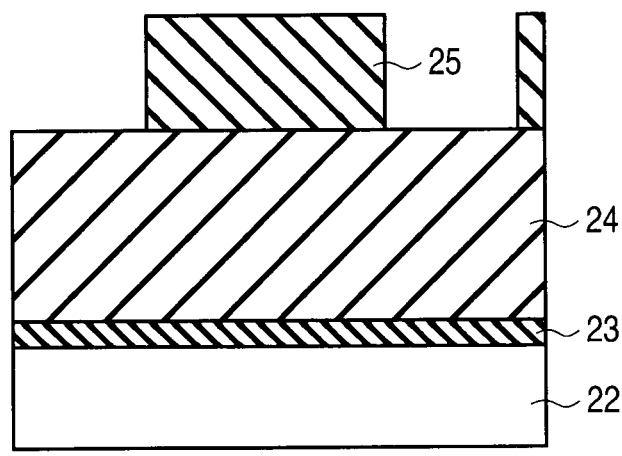
F I G. 8B

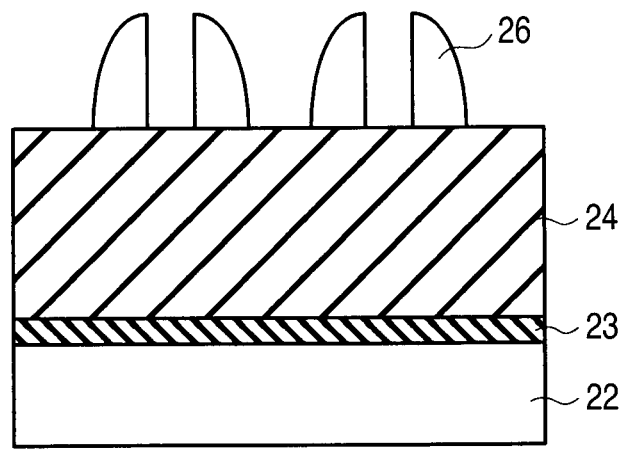
F I G. 10A
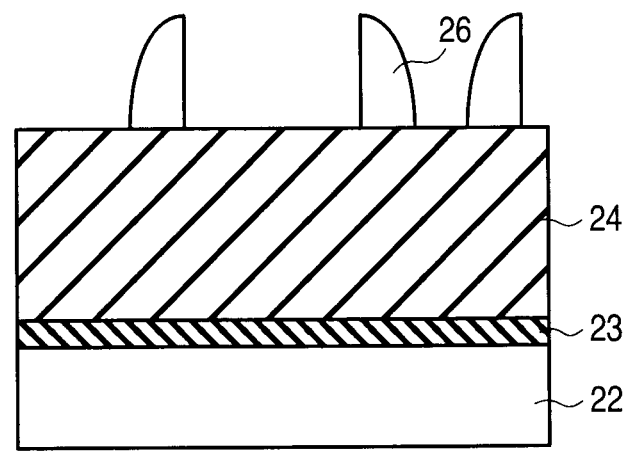
F I G. 10B

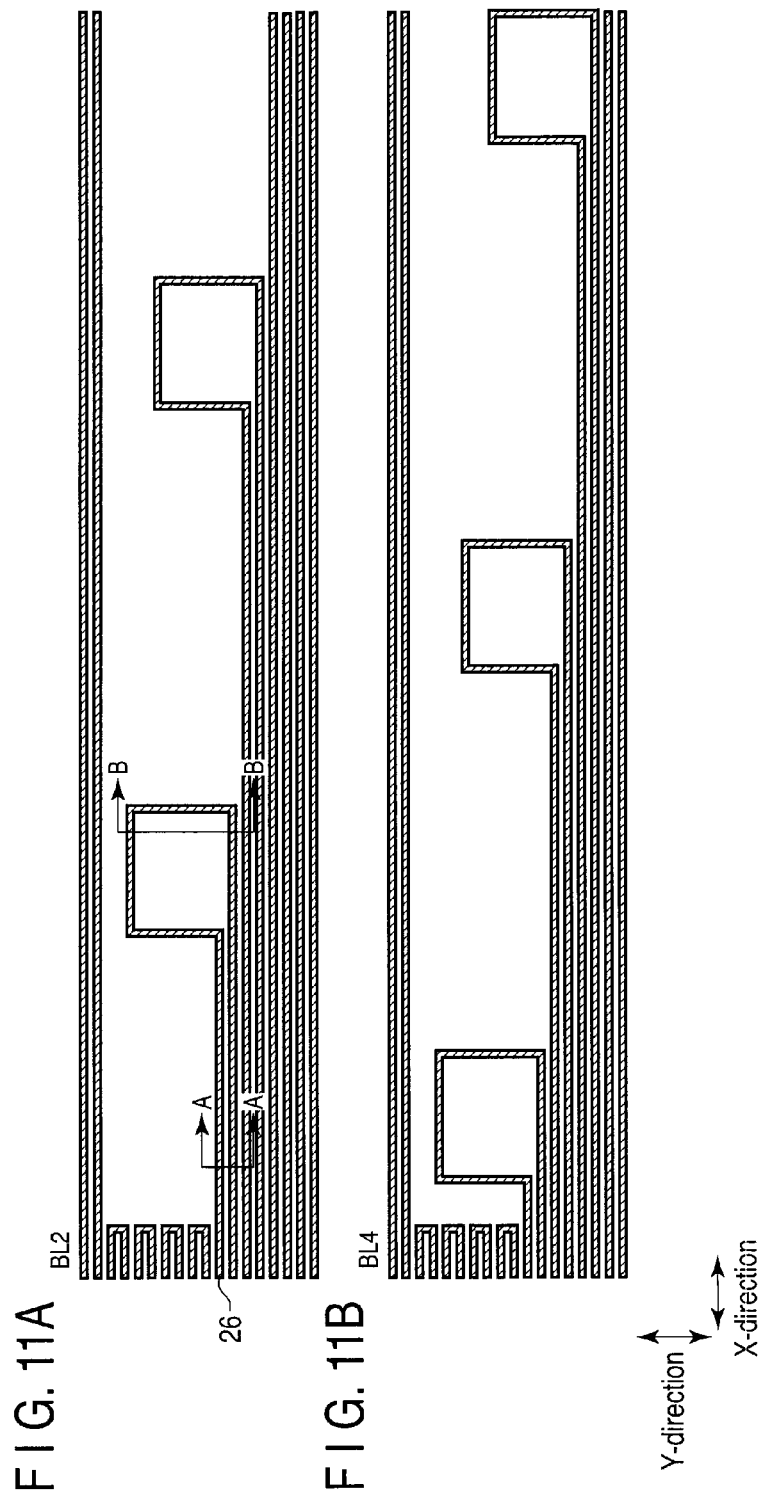

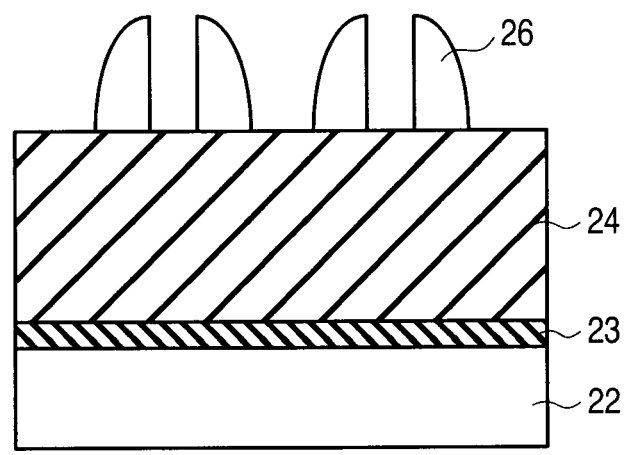
F I G. 12A
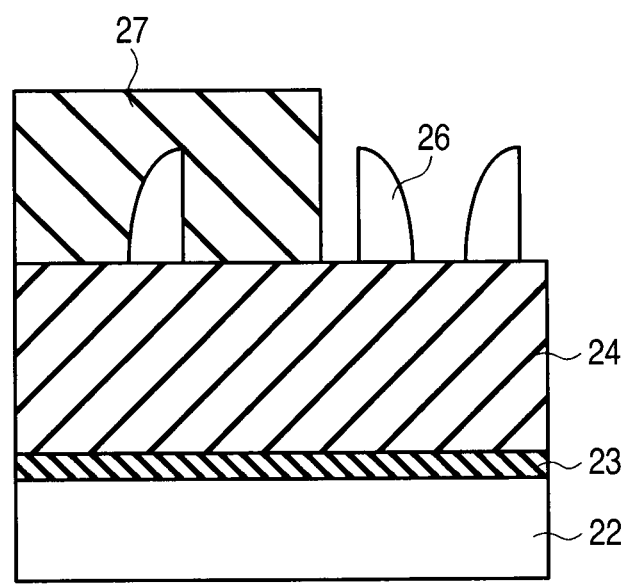
F I G. 12B

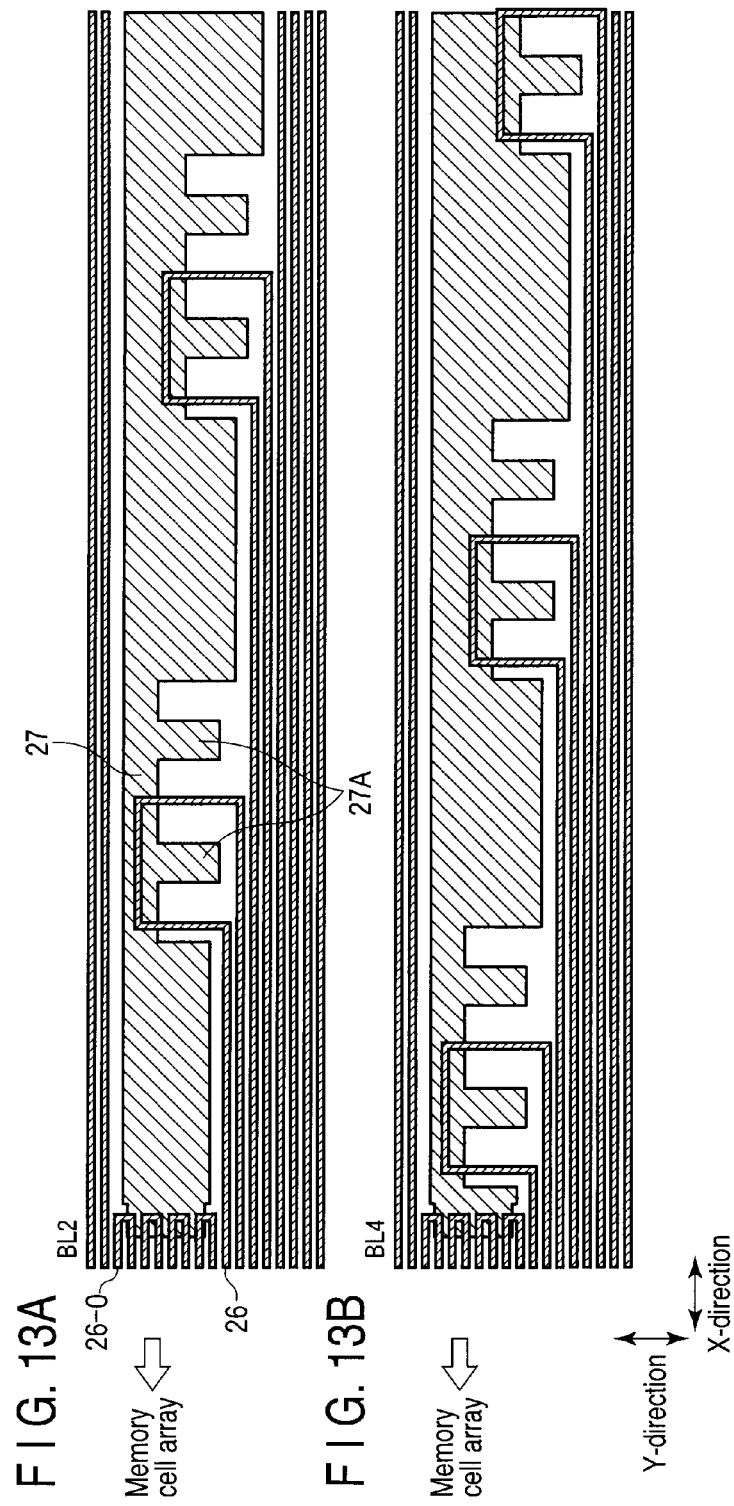
F I G. 13A
F I G. 13B

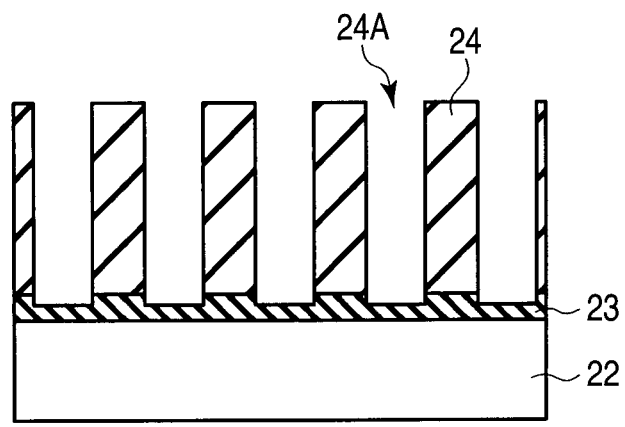
F I G. 14A
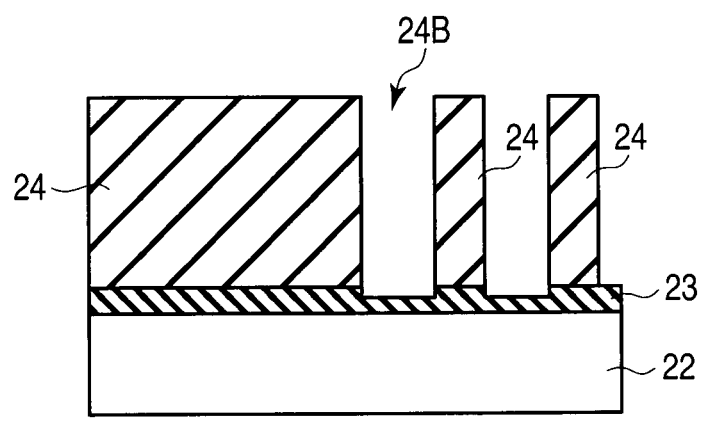
F I G. 14B

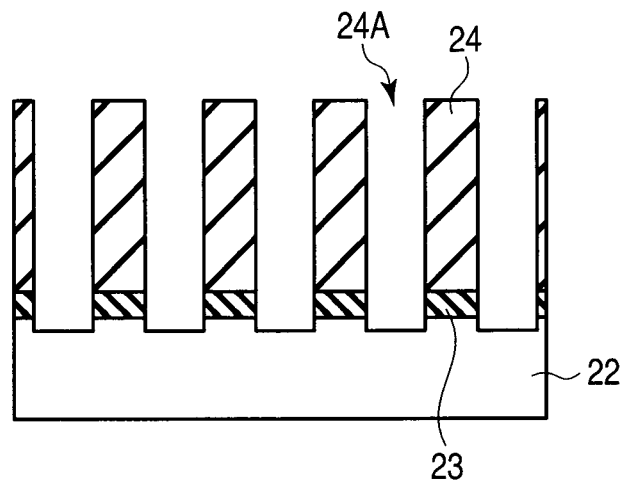
F I G. 15A
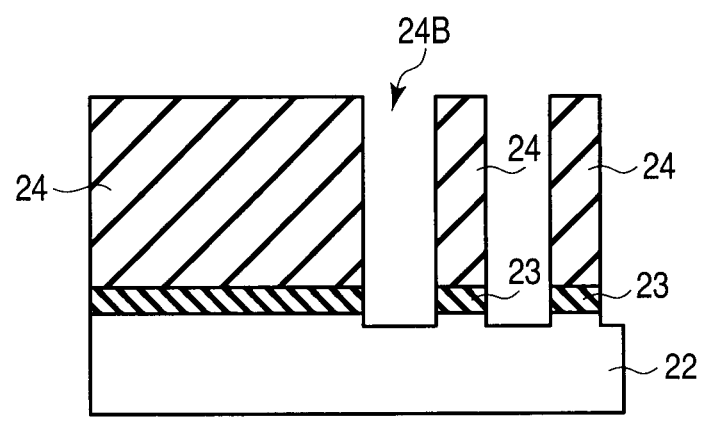
F I G. 15B

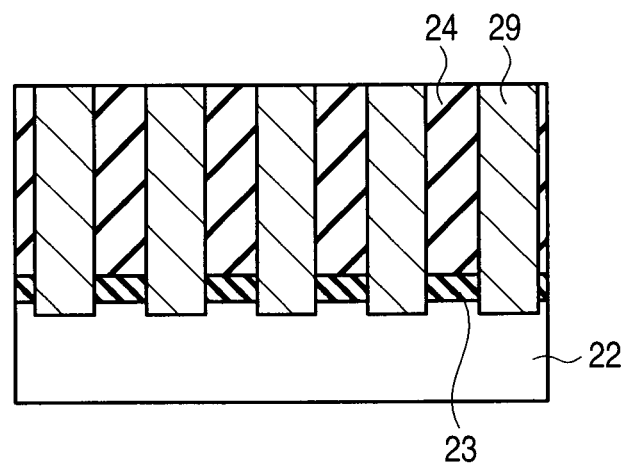
F I G. 16A
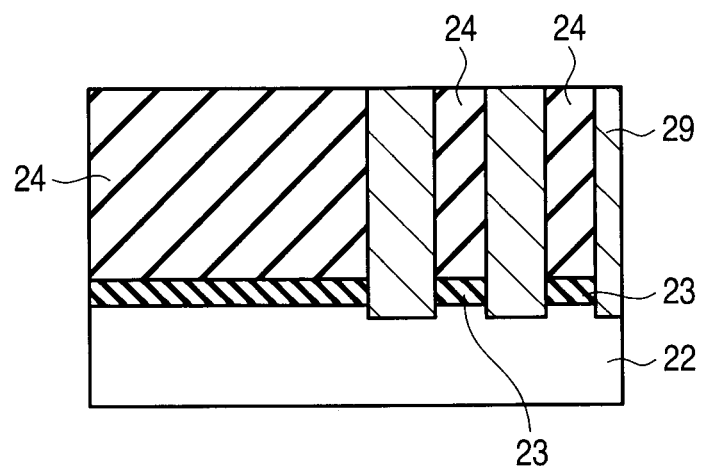
F I G. 16B

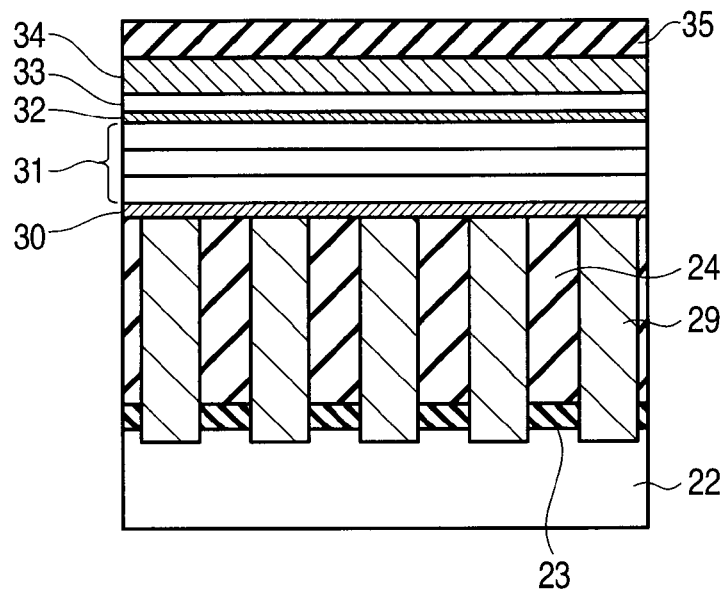
F I G. 17A
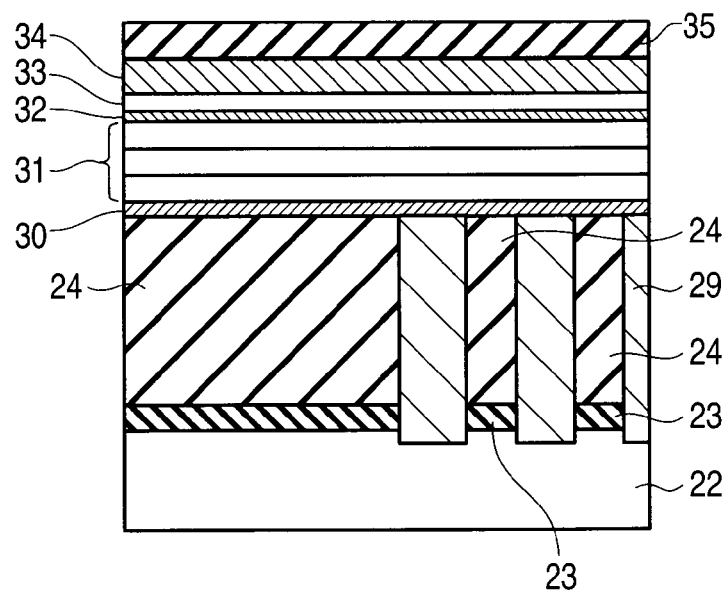
F I G. 17B

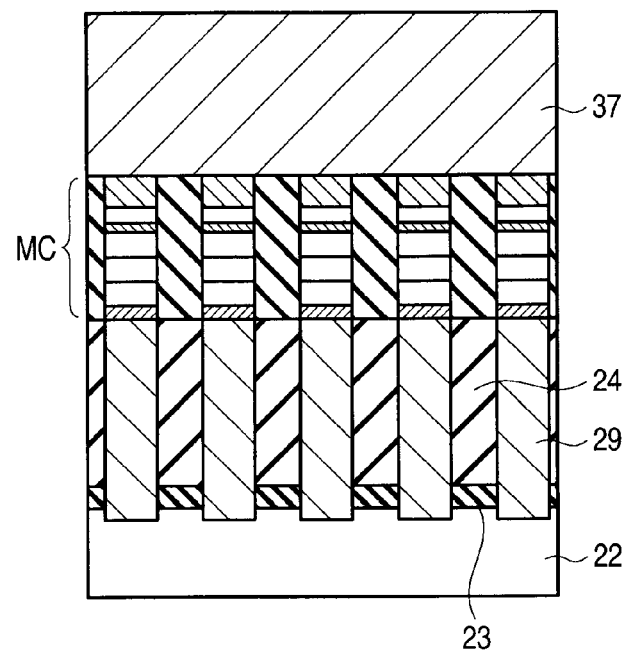
F I G. 19A
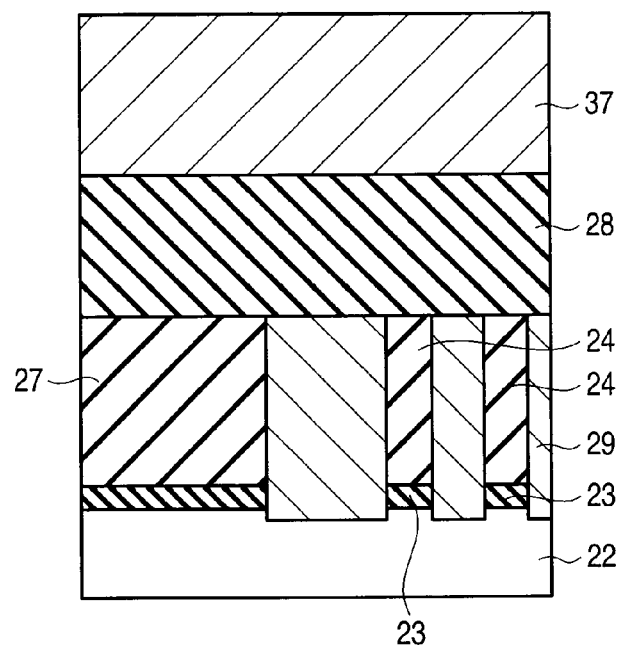
F I G. 19B

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2010-040613, filed Feb. 25, 2010; the entire contents of which are incorporated herein by reference.

FIELD

Embodiments described herein relate generally to a semiconductor memory device and a method of manufacturing the same, for example, a resistance-change memory including an extraction section that connects an interconnect, connected to a memory cell, and a peripheral circuit to each other.

BACKGROUND

Recently, it is difficult to miniaturize a nonvolatile semiconductor memory using a conventional floating gate, so that a resistance-change memory including a three-dimensional crosspoint cell is expected as a candidate for a further high-capacity memory. Among other resistance-change memories, a resistive random access memory (ReRAM) using a variable-resistance element is a leading next-generation nonvolatile semiconductor memory. Meanwhile, resolution is difficult with conventional exposure technology when forming a recent memory device, so that double patterning technology using a sidewall spacer is generally used.

The crosspoint cell of the ReRAM includes the variable-resistance element and a diode between interconnects (word line and bit line) orthogonal to each other and they are arranged in a matrix pattern and in a three-dimensional array pattern on upper and lower layers. When applying a voltage to the variable-resistance element, this transits to a low-resistance state in which resistance decreases at a certain voltage (Vset). This is referred to as set (writing). Also, when applying the voltage to the variable-resistance element in the low-resistance state and applying current, this transits to a high-resistance state at a certain voltage (Vreset). This is referred to as reset (erasing). By detecting the low-resistance state or the high-resistance state as a difference in flowing current, binary 0 or 1 stored in the memory cell is detected.

When manufacturing the three-dimensional crosspoint cell using the double patterning technology, there is the following problem.

Since the number of extraction sections is proportional to "number of interconnect laminations×number of divisions of cell array" in the ReRAM, even when increase in an area is a few microns for each portion, the total area increases exponentially and miniaturization becomes difficult.

BRIEF DESCRIPTION OF THE DRAWINGS

FIG. 1 is a cross-sectional view of a configuration of a resistance-change memory of an embodiment;

FIG. 4 is a cross-sectional view schematically illustrating the memory cell array and an extraction section in the resistance-change memory of the embodiment;

FIGS. 5A and 5B are plan views of a bit line of the extraction section in the resistance-change memory of the embodiment;

FIGS. 6A and 6B are plan views illustrating a method of manufacturing the extraction section in the resistance-change memory of the embodiment;

FIGS. 7A, 7B, 8A, 8B, 9A, 9B, 10A and 10B are cross-sectional views illustrating the method of manufacturing the extraction section in the resistance-change memory of the embodiment;

FIGS. 11A and 11B are plan views illustrating the method of manufacturing the extraction section in the resistance-change memory of the embodiment;

FIGS. 12A and 12B are cross-sectional views illustrating the method of manufacturing the extraction section in the resistance-change memory of the embodiment;

FIGS. 13A and 13B are plan views illustrating the method of manufacturing the extraction section in the resistance-change memory of the embodiment;

FIGS. 14A, 14B, 15A, 15B, 16A, 16B, 17A and 17B are cross-sectional views illustrating the method of manufacturing the extraction section in the resistance-change memory of the embodiment; and FIGS. 18A, 18B, 19A and 19B are cross-sectional views illustrating the method of manufacturing memory cells and the extraction section in the resistance-change memory of the embodiment.

DETAILED DESCRIPTION

Figure 2:
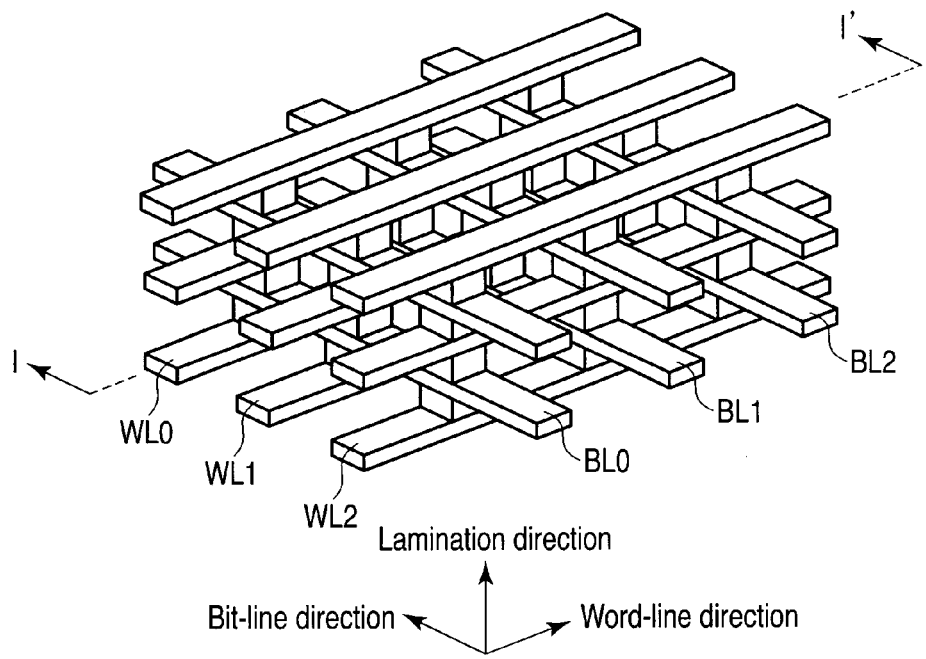
FIG. 2 is a partial perspective view of a memory cell array in the resistance-change memory of the embodiment.

A semiconductor memory device of an embodiment will be hereinafter described with reference to the drawings. A resistance-change memory is herein taken as an example of the semiconductor memory device. In the description, common reference numerals are assigned to common parts throughout the drawings.

In general, according to one embodiment, a semiconductor memory device includes a first interconnect, a second interconnect, a first fringe and a second fringe. The first interconnect is connected to a first memory cell. The second interconnect is connected to a second memory cell and is arranged at a first interval from the first interconnect in a first direction. The first fringe is formed on one end of the first interconnect. The second fringe is formed on one end of the second interconnect. The first fringe and the second fringe are arranged at the first interval in a second direction orthogonal to the first direction.

[1] Configuration of Resistance-Change Memory of Embodiment

FIG. 1 is a cross-sectional view illustrating a configuration of a resistance-change memory of an embodiment.

As illustrated, a peripheral circuit 1 is formed on a semiconductor substrate 100 and a memory cell array 2 is formed on the peripheral circuit 1. Further, an extraction section 3 is formed on the semiconductor substrate 100 adjacent to the memory cell array 2. Although only one extraction section 3 is herein illustrated, the extraction section is also formed on an opposite side across the memory cell array 2 and the extraction section is further formed in a direction orthogonal to the extraction sections (in a depth direction of a plane of paper) across the memory cell.

The peripheral circuit 1 includes a p-channel MOS transistor and an n-channel MOS transistor, and a circuit configured to control set/reset operation and read operation of the memory cell array 2 is formed.

A plurality of memory cells MC each arranged on a position at which a bit line BL and a word line WL intersect with each other are arranged in the memory cell array 2. A plurality of layers of memory cells are laminated, and a four-layered memory cell array 2 is herein illustrated. The memory cell MC includes a variable-resistance element VR and a diode DI connected in series between the bit line BL and the word line WL.

The bit line BL or the word line WL connected to the memory cell MC is extracted to the extraction section 3, and a contact region CR is formed on one end of the bit line BL or the word line WL. An upper interconnect 101 is formed on the memory cell array 2 and a contact material CM that electrically connects the contact region CR, the peripheral circuit 1 and the upper interconnect 101 to one another is formed in the extraction section 3.

[1-1] Configuration of Memory Cell Array

FIG. 2 is a partial perspective view of the memory cell array 2 in the resistance-change memory. Meanwhile, i and j in FIG. 2 are set to 0, 1, 2 and so on.

As illustrated, a plurality of word lines WL0 to WL2, which extend in a word-line direction, are arranged at a predetermined interval in a bit-line direction orthogonal to the word-line direction, and a plurality of bit lines BL0 to BL2, which extend in the bit-line direction, are arranged at a predetermined interval in the word-line direction. The memory cell MC is arranged on each intersection of word lines WL0 to WL2 and bit lines BL0 to BL2 so as to be sandwiched between each of the interconnects. As the word line and the bit line, W, WSi, NiSi, CoSi and the like are used.

In this manner, the memory cell array 2 is configured by laminating the memory cells MC each of which is sandwiched between the word line and the bit line.

[1-2] Memory Cell MC

Figure 3:
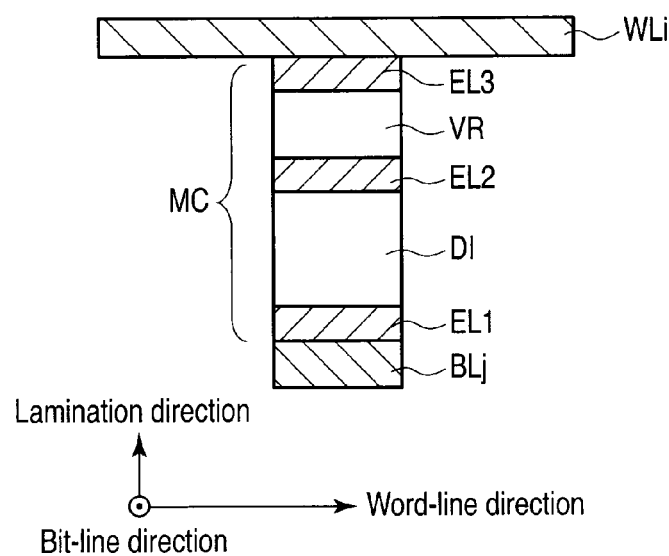
FIG. 3 is a cross-sectional view of one memory cell taken along line I-I' in FIG. 2.

FIG. 3 is a cross-sectional view of one memory cell taken along line I-I' in FIG. 2 as seen in a direction indicated by an arrow.

As illustrated in FIG. 3, the memory cell MC is formed of a circuit in which the variable-resistance element VR and the diode DI are connected in series. The variable-resistance element VR may change in resistance through current, heat, chemical energy and the like by applying a voltage. As the variable-resistance element VR, a complex compound including a cation, which is a transition element the resistance of which changes by movement of the cation may be used, for example.

Electrodes EL1, EL2 and EL3, which serve as a barrier metal and an adhesion layer, are arranged on upper and lower sides of the variable-resistance element VR and the diode DI. Electrode EL1 is arranged on a bit line BLj, the diode DI is arranged on electrode EL1, and electrode EL2 is arranged on the diode DI. The variable-resistance element VR is arranged on electrode EL2 and electrode EL3 is arranged on the variable-resistance element VR. A word line WLj is arranged on electrode EL3.

A description was given of the case where the memory cell includes the variable-resistance element and the diode. However, a variable-resistance element having an asymmetric IV characteristic inherently has a selector function. Therefore, the memory cell is only required to include a variable-resistance element.

[1-3] Extraction Section of Bit line or Word Line

FIG. 4 is a cross-sectional view schematically illustrating the memory cell array 2 and the extraction section 3 in the resistance-change memory. Meanwhile, although an example in which bit lines BL2 and BL4 are extracted on a right side of the memory cell array and bit lines BL1, BL3 and BL5 are extracted on a left side of the memory cell array is illustrated in FIG. 4, actually, any one of the word line and the bit line is extracted on the right and left sides of the memory cell array 2 and the other of the word line and the bit line is extracted in a direction orthogonal thereto.

Herein, the memory cells MC arranged with the word line sandwiched therebetween are set as a memory cell MC pair, and the memory cell pairs are defined as memory cell pairs MC1-1, MC2-1, . . . , MC4-1 from bottom up.

Bit line BL2 connected to an upper end of the memory cell pair MC1-1 and a lower end of the memory cell pair MC2-1 is extracted to the extraction section 3, and a contact region (fringe) CR1 is formed on one end of bit line BL2. A contact material CM1 is connected to contact region CR1 and contact region CR1 is connected to the upper interconnect 101 by contact material CM1 or to a lower interconnect 104 through an interconnect 102 and a via material 103. Further, a driver DR1 that drives bit line BL1 is connected to the lower interconnect 104.

Also, bit line BL3 connected to an upper end of the memory cell pair MC2-1 and a lower end of the memory cell pair MC3-1 is extracted to the extraction section 3, and a contact region (fringe) CR2 is formed on one end of bit line BL3. A contact material CM2 is connected to contact region CR2 and contact region CR2 is connected to an upper interconnect 108 by contact material CM2 or to a lower interconnect 107 through an interconnect 105 and a via material 106. Further, a driver DR2 that drives word line WL2 is connected to the lower interconnect 107.

Also, bit line BL4 connected to an upper end of the memory cell pair MC3-1 and a lower end of the memory cell pair MC4-1 is routed so as not to be brought into contact with contact material CM1 and is extracted to the extraction section 3. A contact region (fringe) CR3 is formed on one end of bit line BL4. A contact material CM3 is connected to contact region CR3 and contact region CR3 is connected to an upper interconnect 101-2 by contact material CM3 or to a lower interconnect 104-2 through an interconnect 102-2 and a via material 103-2. Further, a driver DR3 that drives word line WL2 is connected to the lower interconnect 104-2.

FIGS. 5A and 5B are plan views of the bit line in the extraction section 3. A pattern group illustrated in FIG. 5A includes patterns of bit line BL2 and a pattern group illustrated in FIG. 5B includes patterns of bit line BL4 formed above bit line BL2.

As illustrated in FIG. 5A, bit-line patterns 11-0 to 11-4 of bit line BL2 are formed. Bit-line pattern 11-1 linearly extends in an X-direction (bit-line direction). A rectangular contact region 11-1A is formed on one end of bit-line pattern 11-1, for example. Meanwhile, a first memory cell (not illustrated) is connected to the other end of bit-line pattern 11-1.

Bit-line pattern 11-2 is formed so as to be adjacent to bit-line pattern 11-1 in a Y-direction (word-line direction) orthogonal to the X-direction at a first interval. Bit-line pattern 11-2 linearly extends in the X-direction. The first interval is a half pitch of a pitch of a line and space pattern (minimum processing dimension).

A rectangular contact region 11-2A is formed on one end of bit-line pattern 11-2, for example. Contact region 11-2A is arranged on a position farther from the memory cell array than contact region 11-1A, and contact region 11-1A and contact region 11-2A are arranged in the X-direction at the first interval. Meanwhile, a second memory cell (not illustrated) adjacent to the first memory cell in the Y-direction is connected to the other end of bit-line pattern 11-2.

Bit-line pattern 11-3 is further formed so as to be adjacent to bit-line pattern 11-2 in the Y-direction at the first interval. Bit-line pattern 11-3 linearly extends in the X-direction. A rectangular contact region 11-3A is formed on one end of bit-line pattern 11-3, for example. Contact region 11-3A is arranged on a position farther from the memory cell array than contact region 11-2A, and contact region 11-2A and contact region 11-3A are arranged in the X-direction at a second interval larger than the first interval. Meanwhile, a third memory cell (not illustrated) adjacent to the second memory cell in the Y-direction is connected to the other end of bit-line pattern 11-3.

Further, bit-line pattern 11-4 is formed so as to be adjacent to bit-line pattern 11-3 in the Y-direction at the first interval. Bit-line pattern 11-4 linearly extends in the X-direction. A rectangular contact region 11-4A is formed on one end of bit-line pattern 11-4, for example. Contact region 11-4A is arranged on a position farther from the memory cell array than contact region 11-3A, and contact region 11-3A and contact region 11-4A are arranged in the X-direction at the first interval. Meanwhile, a fourth memory cell (not illustrated) adjacent to the third memory cell in the Y-direction is connected to the other end of bit-line pattern 11-4.

Also, in the memory cell array 2, the word lines, which intersect with bit-line patterns 11-1 to 11-4, are arranged on an upper layer of bit-line patterns 11-1 to 11-4. The first to fourth memory cells are arranged on portions at which one of the word lines and bit-line patterns 11-1 to 11-4 intersect with each other, respectively.

The above-described bit-line patterns are sequentially formed in the pattern group of bit line BL2. Also, bit-line pattern group 11-0 extends to an opposite extraction section across the memory cell array and the contact region is formed on one end thereof (not illustrated).

Also, a pattern group of bit line BL4 illustrated in FIG. 5B is formed above bit line BL2, and has the following configuration.

As illustrated in FIG. 5B, bit-line patterns 12-0 to 12-4 of bit line BL4 are formed. Bit-line pattern 12-1 linearly extends in the X-direction. A rectangular contact region 12-1A is formed on one end of bit-line pattern 12-1, for example. Meanwhile, a fifth memory cell (not illustrated) is connected to the other end of bit-line pattern 12-1.

Bit-line pattern 12-2 is formed so as to be adjacent to bit-line pattern 12-1 in the Y-direction at the first interval. Bit-line pattern 12-2 linearly extends in the X-direction. A rectangular contact region 12-2A is formed on one end of bit-line pattern 12-2, for example. Contact region 12-2A is arranged on a position farther from the memory cell array than contact region 12-1A, and contact region 12-1A and contact region 12-2A are arranged in the X-direction at the first interval. Meanwhile, a sixth memory cell (not illustrated) adjacent to the fifth memory cell in the Y-direction is connected to the other end of bit-line pattern 12-2.

Bit-line pattern 12-3 is further formed so as to be adjacent to bit-line pattern 12-2 in the Y-direction at the first interval. Bit-line pattern 12-3 linearly extends in the X-direction. A rectangular contact region 12-3A is formed on one end of bit-line pattern 12-3, for example. Contact region 12-3A is arranged on a position farther from the memory cell array than contact region 12-2A, and contact region 12-2A and contact region 12-3A are arranged in the X-direction at the second interval larger than the first interval. Meanwhile, a seventh memory cell (not illustrated) adjacent to the sixth memory cell in the Y-direction is connected to the other end of bit-line pattern 12-3.

Further, bit-line pattern 12-4 is formed so as to be adjacent to bit-line pattern 12-3 in the Y-direction at the first interval. Bit-line pattern 12-4 linearly extends in the X-direction. A rectangular contact region 12-4A is formed on one end of bit-line pattern 12-4, for example. Contact region 12-4A is arranged on a position farther from the memory cell array than contact region 12-3A, and contact region 12-3A and contact region 12-4A are arranged in the X-direction at the first interval. Meanwhile, an eighth memory cell (not illustrated) adjacent to the seventh memory cell in the Y-direction is connected to the other end of bit-line pattern 12-4.

Also, in the memory cell array 2, the word lines, which intersect with bit-line patterns 12-1 to 12-4, are arranged on an upper layer of bit-line patterns 12-1 to 12-4. The fifth to eighth memory cells are arranged on portions at which one of the word lines and bit-line patterns 12-1 to 12-4 intersect with each other, respectively.

The above-described bit-line patterns are sequentially formed in the pattern group of bit line BL4. Also, bit-line pattern group 12-0 extends to the opposite extraction section across the memory cell array and the contact region (not illustrated) is formed on one end thereof.

Also, contact materials CM1-1 and CM1-2 are connected to contact regions 12-3A and 12-4A, respectively. Contact materials CM1-1 and CM1-2 pass between contact regions 11-2A and 11-3A to be connected to the upper interconnect and the lower interconnect. That is to say, the pattern groups 12-2 and 12-3 of bit line BL4 are routed so as not to be brought into contact with contact material CM3.

Contact materials CM3-1 and CM3-2 are connected to contact regions 11-1A and 11-2A, respectively. Contact materials CM3-1 and CM3-2 pass between contact regions 11-2A and 11-3A to be connected to the upper interconnect and the lower interconnect. That is to say, the pattern groups 11-2 and 11-3 of bit line BL2 also are routed so as not to be brought into contact with contact material CM1.

As described above, according to this embodiment, contact region 11-1A (or 11-3A, 12-1A, 12-3A) and contact region 11-2A (or 11-4A, 12-2A, 12-4A) are arranged in the X-direction at the first interval, that is, at half pitch (minimum processing dimension). According to this, an area required for forming the contact region may be reduced and the region of the extraction section may be made smaller.

[2] Method of Manufacturing Extraction Section and Memory Cell in Resistance-Change Memory of Embodiment In this embodiment, an extraction section and a memory cell of a resistance-change memory provided with a crosspoint cell are manufactured by using the damascene method and a sidewall process.

Figure 18A:
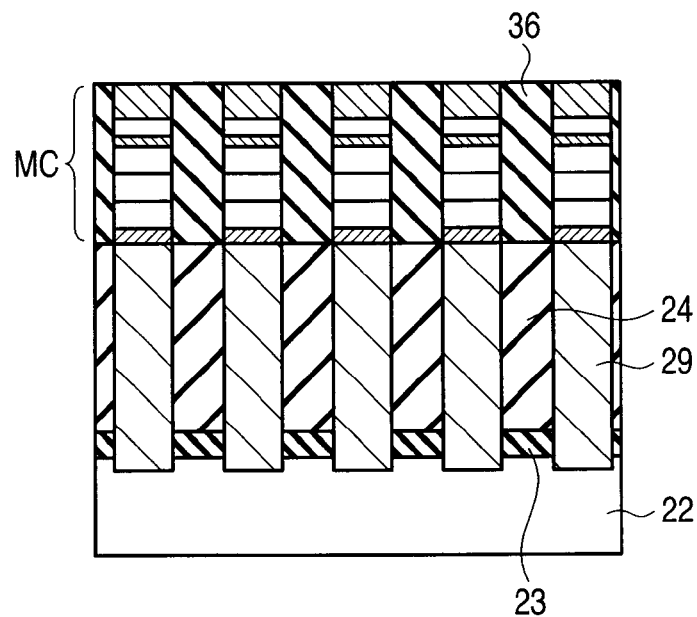

FIGS. 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18B and 19B are views illustrating a method of manufacturing the extraction section illustrated in FIGS. 5A and 5B and the memory cell. Also, FIGS. 18A and 19A are views illustrating a method of manufacturing a memory cell array 2 corresponding to FIGS. 18B and 19B. Meanwhile, the method of manufacturing the extraction section on a bit-line side and the memory cell on a bit line is herein illustrated. Meanwhile, although plan views of bit lines BL2 and BL4 illustrated in FIGS. 6A, 6B, 11A, 11B, 13A and 13B are shown so as to be arranged in a vertical manner for convenience of description, they are not formed simultaneously but the upper bit line BL4 is formed after forming the lower bit line BL2.

A pattern group illustrated in FIGS. 6A, 11A and 13A includes patterns for forming bit line BL2 and a pattern group illustrated in FIGS. 6B, 11B and 13F3 includes patterns for forming bit line BL4 formed above bit line BL2. After forming a CMOS region 22, which becomes a memory device driving unit, on a base including a semiconductor substrate, a resist pattern (resist film) illustrated in FIGS. 6A and 6B is formed.

As illustrated in FIG. 6A, a plurality of resist patterns 21, which extend in an X-direction, are arranged in parallel in a Y-direction orthogonal to the X-direction. A rectangular resist pattern 21A is formed on one end of the resist pattern 21. The rectangular resist patterns 21A are arranged so as to be away from the memory cell array in the X-direction.

Also, a resist pattern 51 of bit line BL4 illustrated in FIG. 6B is formed above bit line BL2, and since this has a similar shape, a description thereof is omitted. However, a rectangular resist pattern 51A is arranged between the rectangular resist patterns 21A in a direction in which bit line BL1 and bit line BL2 are laminated.

Cross-sectional views taken along line A-A in FIG. 6A are illustrated in FIGS. 7A, 8A, 9A and 10A and cross-sectional views taken along line B-B in FIG. 6A are illustrated in FIGS. 7B, 8B, 9B and 10B.

Figure 7A:
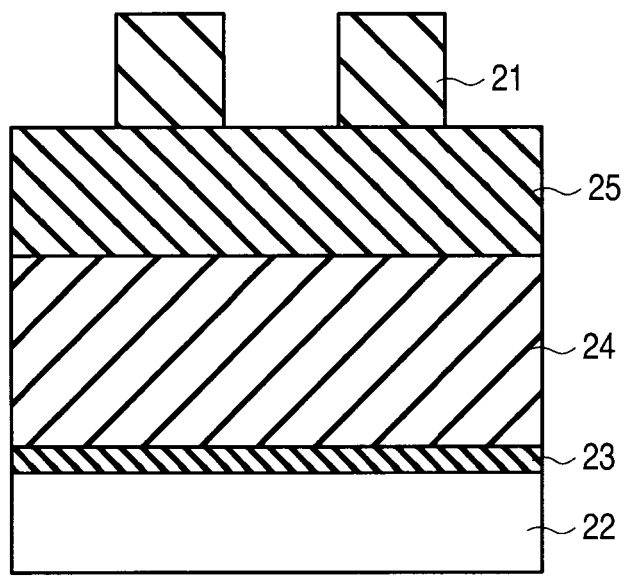
Figure 7B:
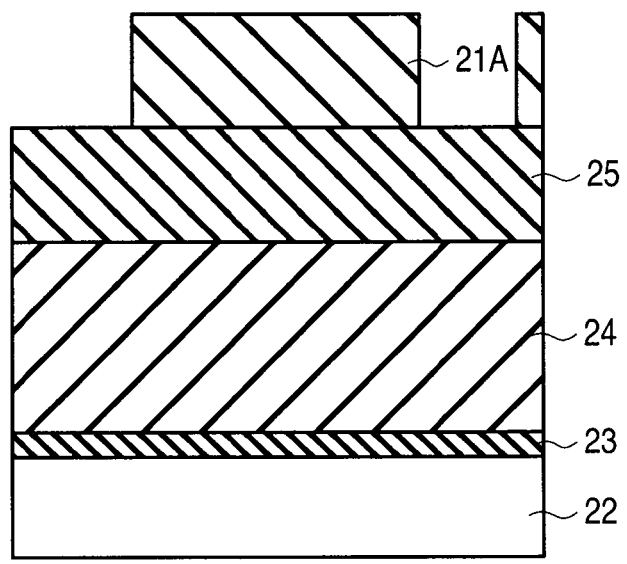

As illustrated in FIGS. 7A and 7B, a silicon nitride (SiN) film 23, for example, which becomes an etching stopper when processing an interconnect groove to be described later, is deposited to a thickness of 20 nm. Thereafter, a silicon oxide ($SiO_2$) film 24, for example, as an interlayer insulating film is deposited to a thickness of 200 nm. Further, a SiN film 25, for example, as a mask material is deposited to a thickness of 100 nm on the silicon oxide film 24. Thereafter, the resist pattern 21 and the rectangular resist pattern 21A illustrated in FIG. 7B are formed using the lithography method.

Next, the SiN film 25 is etched as illustrated in FIGS. 8A and 8B by using the resist pattern 21 and the rectangular resist pattern 21A as a mask. Thereafter, by slimming the SiN film 25, a processing dimension of a width in the Y-direction of the SiN film 25 is finished to a desired dimension (minimum processing dimension [half pitch]).

Figure 9A:
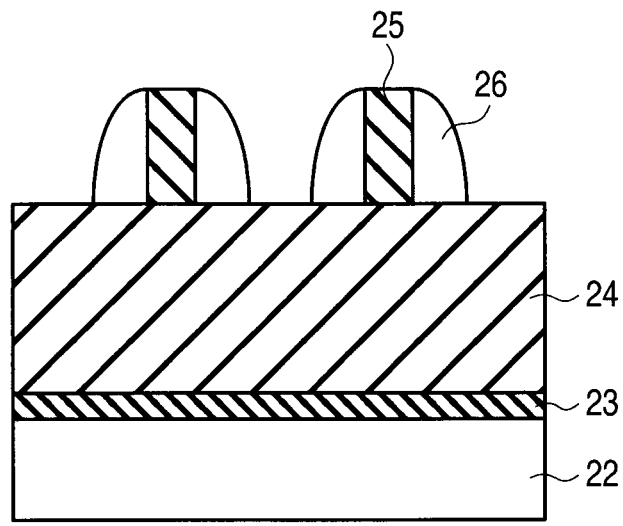
Figure 9B:
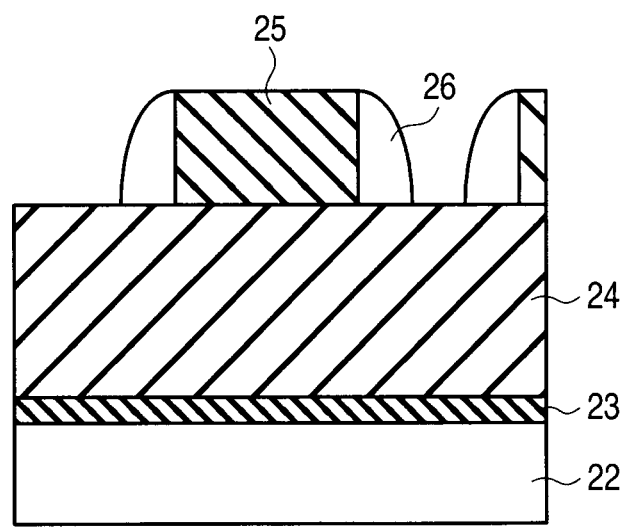

Next, by depositing an amorphous silicon film, for example, on the silicon oxide film 24 and the SiN film 25 and by performing etch back on the amorphous silicon film, a spacer 26 having a film thickness of half pitch is formed on a sidewall of the SiN film 25, as illustrated in FIGS. 9A and 9B.

Next, by selectively removing the SiN film 25 by a hot phosphate treatment, for example, the spacer 26 is left as illustrated in FIGS. 10A and 10B. FIGS. 11A and 11B are plan views at that time.

In order to connect bit lines BL2 and BL4 to each driver by a contact material CM, it is necessary to provide a connecting section (contact region) of each of bit lines BL2 and BL4 on different positions in the X-direction as seen from above. After forming the spacer 26 and removing the SiN film 25 as the mask material, a portion of the contact region is formed into a ring shape, other portion including a memory cell array section is formed into a line-and-space shape, and the spacer 26 is formed as the mask material.

Next, a part of the spacer 26 is covered with a resist pattern 27 as illustrated in FIG. 12B by the photolithography method in order to separately form the patterns on the memory cell array section and the extraction section. Meanwhile, when there is a peripheral circuit section arranged on an outer periphery of the extraction section 3, a pattern of the peripheral circuit is simultaneously formed by the resist pattern 27. FIGS. 13A and 13B are plan views at that time. As illustrated, a region in which a bit-line pattern and a contact region are not formed is covered with the resist pattern 27 and the spacer 26. That is to say, the bit line BL and the contact region are formed of embedded interconnects, and the silicon oxide film 24 except a region in which the interconnect groove for embedding the bit line BL and a contact groove for embedding the contact region are to be formed is protected by the spacer 26 and the resist pattern 27.

Herein, it is configured such that the extraction section 3 is formed alternately on both sides of the memory cell array 2 in the X-direction for each eight spacers 26. In order to separate the bit line to be extracted to an opposite extraction section of the memory cell array, an end of a part of a spacer 26-0 is covered with the resist pattern 27. Also, in order to form the contact region to connect the contact material, a convex shape 27A is formed on the resist pattern 27 as illustrated in FIGS. 13A and 13B.

Thereafter, an interconnect groove 24A and a contact groove 24B are formed by etching the silicon oxide film 24 by using the resist pattern 27 and the amorphous silicon spacer 26 as the mask materials as illustrated in FIGS. 14A and 14B. At this time, in order to prevent variation in depth due to over-etching when processing the interconnect groove 24A and the contact groove 24B, the SiN film 23 as the stopper is arranged under the silicon oxide film 24. Therefore, the etching of the interconnect groove 24A and the contact groove 24B stops on an upper surface of the SiN film 23 or in the middle of the SiN film 23. Subsequently, the resist pattern 27 and the spacer 26 are removed.

Next, as illustrated in FIGS. 15A and 15B, the SiN film 23 on the bottom of the interconnect groove 24A and the contact groove 24B is removed by entire surface etch back. According to this, in the memory cell array 2, an electrode EL3 of a memory cell MC is exposed from the interconnect groove.

Next, a TiN film, for example, is formed in the interconnect groove 24A, in the contact groove 245 and on the silicon oxide film 24 as a barrier metal, and a tungsten film 29 is further formed on the TiN film. Then, as illustrated in FIGS. 16A and 16B, extra tungsten film 29 and TiN film on the silicon oxide film 24 are polished by the CMP method to flatten the silicon oxide film 24. According to this, the lower interconnect layer, that is, the bit-line pattern and the contact region illustrated in FIG. 5A are formed in the interconnect groove 24A and in the contact groove 24B.

Also, in the memory cell array 2, electrode EL3 of the memory cell MC and bit line BL2 are connected to each other.

In the above-described embodiment, it is possible to (1) form the memory cell array section and the extraction section separately and to (2) separate the pattern formed into the ring shape by the sidewall simultaneously by forming the resist pattern 27 and etching thereafter, so that the number of exposures (number of times of lithography) required for forming the interconnect of one layer may be set to twice.

Figure 18B:
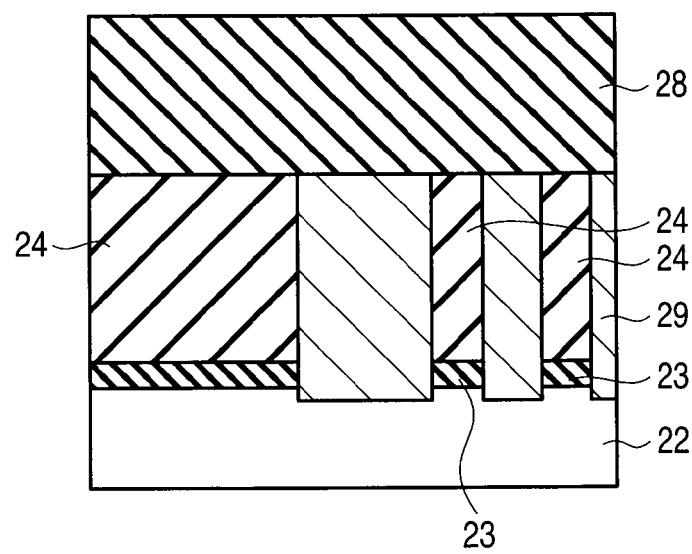

Next, cross-sectional views illustrating a method of manufacturing the memory cell on an upper layer of bit line BL2 are illustrated in FIGS. 17A, 18A and 19A, and cross-sectional views illustrating a method of manufacturing the contact region are illustrated in FIGS. 17B, 18B and 19B. Meanwhile, a process until forming the tungsten film 29 as the bit-line pattern is similar to the process illustrated in FIGS. 7A, 8A, 9A, 10A, 12A, 14A, 15A and 16A.

As illustrated in FIGS. 17A and 17B, a barrier metal 30, a diode 31, a barrier metal 32, a variable-resistance element 33 and an upper electrode 34 are formed on the tungsten film 29 and the silicon oxide film 24. Thereafter, a silicon oxide film 35 is deposited to a thickness of 400 nm as a processing mask material.

Subsequent to the process in FIG. 17A, a cross-sectional view of the memory cell array 2 is illustrated in FIGS. 18A and 19A in order to illustrate the method of manufacturing the memory cell array 2. As illustrated in FIG. 18A, after forming a resist into a circular matrix pattern, the silicon oxide film 35 is processed into a cylindrical shape by using the resist as the mask material. Next, the memory device MC is formed by processing the barrier metal 30, the diode 31, the barrier metal 32, the variable-resistance element 33 and the upper electrode 34 into a cylindrical shape by using the silicon oxide film 35 as the mask material. Next, an interlayer insulating film 28 formed of the silicon oxide film is deposited and is flattened using an upper electrode material as the mask by the CMP method to expose an upper surface of the electrode 34.

On the other hand, the extraction section 3 is also formed by the process identical to the process illustrated in FIG. 18A. As illustrated in FIG. 18B, the memory cell MC is not formed on the extraction region 3, so that the mask pattern is not formed on the mask material 35. Thereafter, since the silicon oxide film 35 as the mask material is not formed on the extraction region 3, the barrier metal 30, the diode 31, the barrier metal 32, the variable-resistance element 33 and the upper electrode 34 are removed. Next, by depositing the interlayer insulating film 28 formed of the silicon oxide film, an upper surface of the tungsten film 29 is covered with the interlayer insulating film 28.

The above-described interconnect layer formation, memory cell formation and interconnect layer formation are repeated in the following process. FIGS. 19A and 19B are diagrams in which the interconnect layer 37 is formed after forming the memory cell. Herein, since the interconnect layer 29 is the bit line, the interconnect layer 37 is a word line.

Before forming bit line BL5, although not illustrated, an opening is formed in the interlayer insulating film for forming contact materials CM1 to CM3. The opening is formed integrally from an upper side to a lower side. At that time, the opening exposes a part of contact regions CR1 to CR3 and a bottom portion thereof reaches interconnects (pads) 102, 102-1 and 105. Thereafter, the contact material is formed by embedding a conductive material in the opening, and the contact material and the word line, and the contact material and the bit line are connected to each other. As a result, the word line and the bit line are connected to the driver. The contact material was described as being formed prior to the formation of bit line BL5. However, the contact material may be formed after the formation of bit line BL5.

As described above, when forming groove interconnect by using the resist pattern 27 and the spacer 26 as the mask material, a contact region (engagement portion) 11-1A and the like to finally connect the contact material is formed into a concave shape. By forming the contact material into a rectangular shape and by forming the contact material on the contact region, it is possible to connect the contact material to the contact regions on a plurality of layers. The contact material indicated by a solid line in FIGS. 5A and 5B indicates the contact material engaged with the layer and the contact material indicated by a broken line indicates the contact material engaged with another layer.

Also, as illustrated in FIG. 4, contact material CM1 finally falls on the interconnect (pad) 102 formed by the process identical to that of bit line BL1 and is connected to the peripheral circuit through the via material 103 and a lower interconnect 104. Also, an upper interconnect 101 formed by the process identical to that of bit line BL5 is formed on an upper layer of contact material CM1.

For example, when the extraction section is provided for each four interconnect layers, there are two resist patterns on each side, and it is necessary to form contact regions equal in number to "4×number of laminations" by shifting in the X-direction in the drawing by the number of laminations for the four obtained interconnect layers. Since there are two upper and two lower bit lines in a four-layered one, it is necessary to form eight contact regions arranged in the X-direction.

As a comparative example, a case in which conventional double patterning technology is simply applied to a three-dimensional crosspoint cell will be described.

First, a tungsten film, which becomes an interconnect layer is formed, for example. Subsequently, a silicon nitride film is formed as a mask material for interconnect processing and an oxide film is further formed. Next, a resist is formed by exposure technology at a pitch twice as large as that of a memory device finally formed on a cell array section and the oxide film is processed using the resist as the mask.

Next, the oxide film is thinned by a wet process (slimming) to obtain a target dimension (half pitch). Further, by forming an amorphous silicon film and performing etch back, a spacer is formed on a sidewall of the oxide film with a width equal to half the pitch.

Next, the resist is formed on an extraction section by the exposure technology and an HF treatment is performed using the resist as the mask material. According to this, the oxide film of a resist opening is removed and only the spacer is left. On a region covered with the resist, a shape obtained by patterning by a first resist is left, and on an exposed region, the pattern is formed into a ring shape only on an outer periphery of the pattern formed by the first resist with the width of the spacer.

Next, after removing the resist, the silicon nitride film is processed by using the spacer and the oxide film as the mask material. According to this, it is possible to separately form a thin line of a desired pitch on the cell array section and wide interconnect on a peripheral circuit section. However, all the thin lines are formed into the ring shape at that stage and it is necessary to cut them one by one. The resist whose portion to cut is opened is formed by the exposure technology, and thereafter, the silicon nitride film is processed using the resist as the mask material. According to this, a line-and-space is formed at a desired pitch.

Next, by using the silicon nitride film as the mask material, the tungsten film, which is the interconnect layer, is processed. Thereafter, by embedding an application-type oxide film and flattening by the CMP method, the tungsten film is exposed. According to this, the interconnect layer is formed.

Thereafter, films, which become a diode and a variable-resistance element, are formed and a memory cell is formed into the cylindrical shape by etching the films.

When manufacturing the three-dimensional crosspoint cell using such sidewall process, there is the following problem.

As described above, when forming the interconnects of one layer, three exposures are required when (1) forming a normal resist pattern, (2) when separately forming a wide pattern of the extraction section and the like and the line formed with the minimum processing dimension (half pitch) of the cell array section and the like, and (3) cutting the pattern formed into the ring shape. Especially, the number of exposures increases by the number of layers to be formed in the three-dimensional crosspoint cell, so that it is difficult to reduce the manufacturing cost.

Also, when separately forming the peripheral circuit section and the cell array section, the silicon oxide film, which becomes the mask material, is selectively removed by the wet process and wet liquid leaks from a resist border because of the isotropic etching property of the wet process, so that it is necessary to ensure an extra region of approximately 0.2 to 0.4 µm as an etching bias. In the three-dimensional crosspoint cell, each word line and bit line is connected to a driver, so that it is necessary to ensure a connecting region in the extraction section of the word line and the bit line by the number of interconnect layers laminated.

Also, in a ReRAM, unlike a NAND flash memory, it is necessary to divide the cell array into smaller scale, to provide the extraction section in each cell array and to separately drive them. This is because the total leakage current due to the leakage current of the diode in a state in which a voltage of inverse bias is applied to the diode increases, for example, when a number of cells are connected to one interconnect because of the structure of the ReRAM in which the variable-resistance element and the diode are connected in series.

Also, when the region of the extraction section increases, it is necessary to arrange a dummy region in order to prevent dishing in the course of CMP and a ratio of the extraction section to the cell array section further increases.

That is to say, a distance between contact regions increases by the etching bias by the isotropic etching property of the wet liquid, that is, by taking into account retreat of the contact region due to the leakage of the wet liquid when removing the mask material (core material) in the comparative example. However, according to this embodiment, the distance between adjacent contact regions is determined by the film thickness of the amorphous silicon spacer, so that this distance is the minimum processing dimension (half pitch). According to this, the area of the extraction section may be significantly reduced.

Although the four-layered one is taken as an example in this embodiment, it is possible to form an eight-layered one by setting the four layers as a basic unit (one set), loading two sets, and forming by shifting the extraction sections.

Further, in this embodiment, the contact region (engagement portion) is formed into the concave shape and is connected on both sides of the contact material (double-sided engagement). However, this is not a limitation and a layout in which the contact region is formed into a square shape and is engaged on one side of the contact material is also possible (single-sided engagement).

In this embodiment, the interconnects may be formed using the damascene method in the extraction section of the interconnects (word line and bit line) and the number of processes may be reduced in comparison with the case of using the RIE method.

As described above, the embodiment may provide the semiconductor memory device capable of decreasing the region of the extraction section of the interconnect connected to the memory cell and making the storage capacity large. Also, the method of manufacturing the semiconductor memory device capable of reducing the number of processes to manufacture the extraction section and reducing the cost may be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell and a second memory cell formed coplanar on a same layer above a substrate;
a first interconnect connected to the first memory cell and extending to a second direction which parallels to a main surface of the substrate;
a second interconnect connected to the second memory cell and arranged at a first interval from the first interconnect to the second interconnect in a first direction which parallels to the main surface of the substrate and the first interval orthogonal to the second direction, and the second interconnect extending to the second direction, the first interconnect and the second interconnect being formed on a same layer above the substrate;
a first fringe provided at one end of the first interconnect, the first fringe being formed on the same layer as the first interconnect;
a second fringe provided in the second interconnect, the second fringe being formed on the same layer as the first fringe and the second interconnect; and
a third interconnect orthogonal with the first interconnect and the second interconnect and from a top view is arranged on an upper layer of the first interconnect and the second interconnect,
wherein the first fringe and the second fringe are arranged at the first interval in the second direction,
the first memory cell is directly connected between the first interconnect and the third interconnect, and the second memory cell is directly connected between the second interconnect and the third interconnect, and
each of the first and second memory cells include a variable-resistance element.

2. The semiconductor memory device according to claim 1, further comprising:
a seventh interconnect arranged at the first interval from the second interconnect in the first direction;
a fourth interconnect arranged at the first interval from the seventh interconnect in the first direction;
a third fringe provided at one end of the seventh interconnect; and
a fourth fringe provided at one end of the fourth interconnect,
wherein the third fringe and the fourth fringe are arranged at the first interval in the second direction, and
an interval between the second fringe and the third fringe is larger than the first interval.

3. The semiconductor memory device according to claim 2, further comprising:
a fifth interconnect and a sixth interconnect formed on an upper layer of the first interconnect and the second interconnect and extending in the same direction as the first interconnect and the second interconnect;

a fifth fringe provided at one end of the fifth interconnect;

a sixth fringe provided at one end of the sixth interconnect;

a first contact material connected to the fifth fringe and extending from the fifth fringe toward a third direction orthogonal to the first direction and the second direction; and a second contact material connected to the sixth fringe and extending from the sixth fringe toward the third direction, wherein the fifth fringe and the sixth fringe are arranged at the first interval in the second direction, and the first and second contact materials are arranged between the second fringe and the third fringe.

4. The semiconductor memory device according to claim 3, further comprising:

a lower interconnect formed on a lower layer of the first interconnect and the second interconnect, wherein the first and second contact materials are connected to the lower interconnect.

5. The semiconductor memory device according to claim 1, further comprising:

a seventh interconnect connected to a third memory cell and arranged at the first interval from the first interconnect in the first direction;

a fourth interconnect connected to a fourth memory cell and arranged at the first interval from the third interconnect in the first direction;

a third fringe provided at one end of the seventh interconnect and arranged on a side opposite to the first and second fringes across the third memory cell; and a fourth fringe provided at one end of the fourth interconnect and arranged on a side opposite to the first and second fringes across the fourth memory cell.

6. The semiconductor memory device according to claim 1, wherein the first interval is a minimum processing dimension.

7. The semiconductor memory device according to claim 1, wherein each of the first and second memory cells include a variable-resistance element and a diode.

8. The semiconductor memory device according to claim 1, wherein the first interconnect and the second interconnect include a bit line and the third interconnect includes a word line.

9. The semiconductor memory device according to claim 1, wherein a spacing between the first fringe and the second fringe in the second direction is equal to the first interval on the same layer.

10. The semiconductor memory device according to claim 1, wherein the first fringe and the second fringe include expanded portions in a same side of the first direction, respectively, and the expanded portions of the first fringe is adjacent with the second fringe with a spacing of the first interval in the second direction.

* * * * *